US008324977B2

(12) United States Patent
Li et al.

(10) Patent No.: US 8,324,977 B2
(45) Date of Patent: Dec. 4, 2012

(54) OSCILLATOR CIRCUIT

(75) Inventors: Hao Li, Munich (DE); Saverio Trotta, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 53 days.

(21) Appl. No.: 12/937,874

(22) PCT Filed: May 13, 2008

(86) PCT No.: PCT/IB2008/051881
§ 371 (c)(1),
(2), (4) Date: Oct. 14, 2010

(87) PCT Pub. No.: WO2009/138816
PCT Pub. Date: Nov. 19, 2009

(65) Prior Publication Data
US 2011/0032045 A1    Feb. 10, 2011

(51) Int. Cl.
*H03B 5/12* (2006.01)
*H03L 1/00* (2006.01)
(52) U.S. Cl. .................. 331/117 R; 331/185; 331/186
(58) Field of Classification Search ............ 331/117 FE, 331/117 R, 167, 185, 186
See application file for complete search history.

(56) References Cited

U.S. PATENT DOCUMENTS

| | | | | |
|---|---|---|---|---|
| 5,379,003 A | * | 1/1995 | Bizen ......................... | 331/117 R |
| 5,534,825 A | * | 7/1996 | Goma et al. ............... | 331/117 R |
| 6,310,522 B1 | * | 10/2001 | Wang et al. ...................... | 331/56 |
| 6,593,822 B2 | * | 7/2003 | Nakano et al. .................. | 331/74 |
| 6,788,160 B2 | | 9/2004 | Keller | |
| 7,053,722 B2 | | 5/2006 | Rein et al. | |
| 7,068,115 B2 | * | 6/2006 | Austin et al. ............. | 331/107 SL |
| 7,164,324 B2 | * | 1/2007 | Guebels ................... | 331/117 FE |
| 7,538,630 B2 | * | 5/2009 | Numata et al. ............ | 331/177 V |
| 7,688,153 B2 | * | 3/2010 | Jacobsson et al. ....... | 331/117 FE |
| 7,724,099 B2 | * | 5/2010 | Sano et al. ............... | 331/107 SL |
| 7,764,127 B2 | * | 7/2010 | Sun et al. ..................... | 331/36 C |
| 2004/0233006 A1 | | 11/2004 | Du Toit | |
| 2006/0049880 A1 | | 3/2006 | Rein et al. | |

FOREIGN PATENT DOCUMENTS

GB      876052 A      8/1961
GB    2274033 A      7/1994

OTHER PUBLICATIONS

Li Hao et al: "Fully Integrated SiGe VCOs with Powerful Output Buffer for 77-GHz Automotive Radar Systems and Applications Around 100 GHz", IEEE Journal of Solid-State Circuits, vol. 39, No. 10, Oct. 2004, pp. 1650-1658.
International Search Report and Written Opinion correlating to PCT/IB2008/051881 dated Aug. 27, 2008.

* cited by examiner

*Primary Examiner* — Levi Gannon

(57) ABSTRACT

The invention relates to an oscillator circuit comprising: a VCO core having an output terminal for providing an oscillatory output signal thereat and having a supply terminal for receiving a supply voltage from a voltage supply, a subsequent circuit coupled to the VCO core's output terminal and having a supply terminal for receiving a supply voltage from the voltage supply. According to the invention, a decoupling member is arranged between the VCO core's supply terminal and the subsequent circuit's supply terminal for preventing high-frequency signals generated by the subsequent circuit at its supply terminal from entering the VCO core. The decoupling member may comprise a transmission line the length of which is one quarter wavelength associated with a second-harmonic oscillation.

19 Claims, 4 Drawing Sheets

OSCILLATOR CIRCUIT

FIELD OF THE INVENTION

This invention relates to an oscillator circuit and a radar system.

BACKGROUND OF THE INVENTION

The main aspects of the prior art oscillator circuit 10 shown in FIG. 1 have been described in U.S. Pat. No. 7,053,722 B2. The circuit 10 comprises as its core element a VCO circuit (VCO core) 8 for generating an oscillatory voltage between output terminals 56 and 56'. The VCO core comprises a bipolar transistor 30 the base of which is coupled to an inductor 32 and the emitter of which is coupled to a capacitor 18. The capacitor 18 is implemented here as a varactor (variable capacitance diode), tunable by means of a tuning voltage at a tuning terminal 22. The circuit is symmetric with respect to a symmetry axis passing through virtual ground nodes 60, 34, 44 at which there is no fundamental current. The VCO core is powered by means of a supply voltage provided between a ground terminal 12 and a DC voltage supply terminal 28. The VCO core 8 is coupled to the ground terminal 12 via a current source 14 and at the node 60 to the supply terminal 28 via a non-essential forward-sense diode 62. The diode 62 mainly serves to somewhat lower the potential at the node 60 with respect to the supply potential provided at the terminal 28. A number of supplementary inductors 58, 54, 50, 46, and their "mirror" counterparts 58', 54', 50', 46' complete the resonator 8.

An inductor 64 is shown between the supply terminal 28 and the diode 62. It represents the inductance of the bond wires by which the oscillator circuit, situated on a chip, is connected to the external supply terminal 28. The bond wire inductance 64 is an undesired effect, as it allows for spurious high-frequency signals to be present on the common power-line comprising nodes 52, 66, 70 serving to supply a voltage not only to the VCO core circuit but also to a subsequent circuit 6 comprising a buffer 68 and a two-stage power amplifier (PA) 74 coupled in series. The buffer 68 takes the differential voltage output at the VCO core's output terminals 56 and 56' and passes it on to the amplifier 74, which produces an amplified voltage or current between the load terminals 78 and 80 for driving an antenna or other subsequent circuit (not shown) coupled between the terminals 78 and 80. The buffer 68 and the PA 74 also improve the decoupling between the oscillator core 8 and the extended load by attenuating what is known as the pulling effect. However, the buffer 68 and the PA 74 nearly always work in large signal conditions and therefore they generate many harmonic signals. These harmonic signals can easily enter the resonator circuit through the voltage supply line, passing through the nodes 72, 70, 66, 52 and 60 to the resonators differential output terminals 56, 56', thereby increasing the resonators 8 phase noise by a down-conversion of these signals into the oscillator signal.

SUMMARY OF THE INVENTION

The present invention provides an oscillator circuit and a radar system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
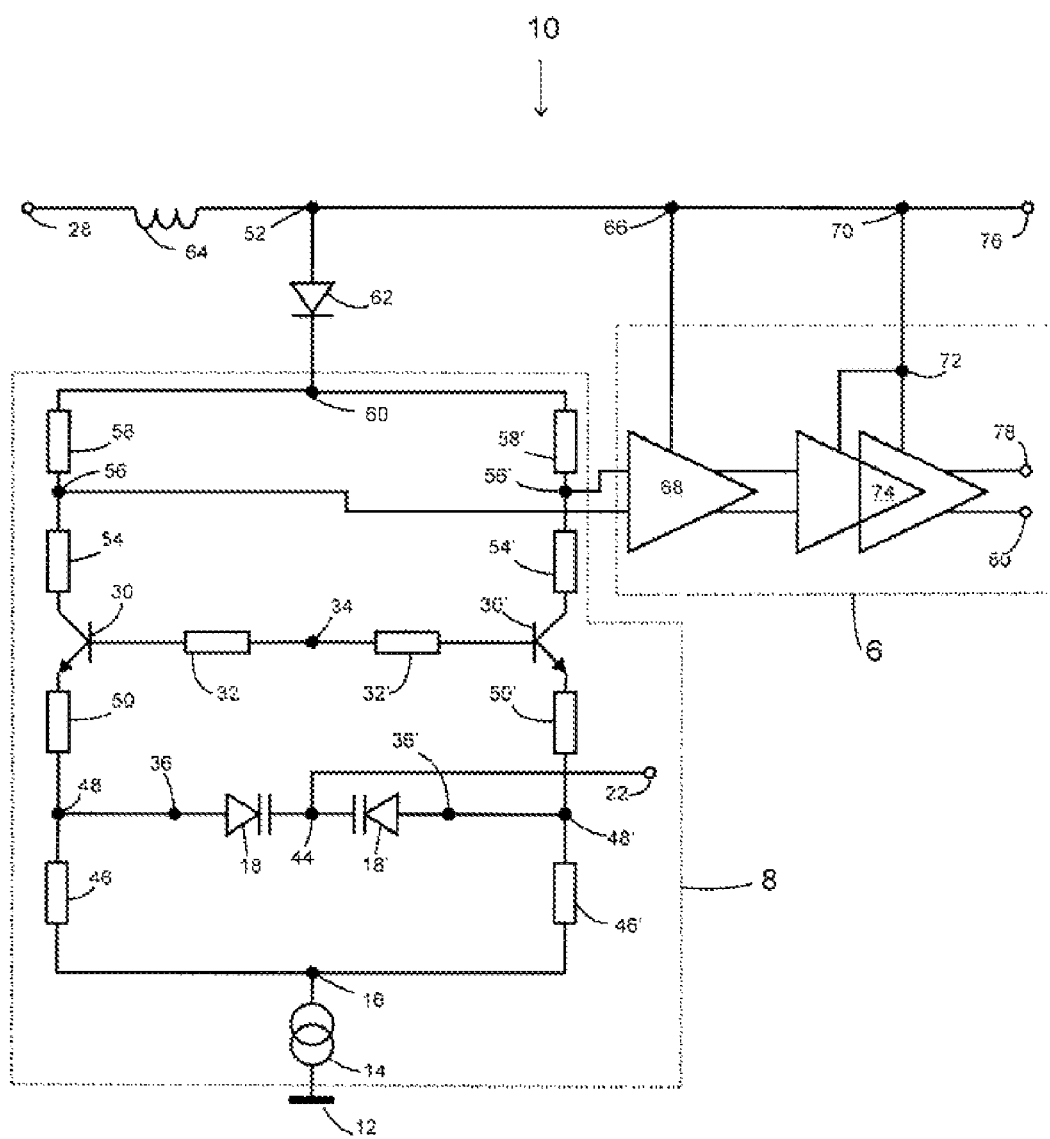
FIG. 1 schematically shows an example of a generic prior-art oscillator circuit comprising a resonator and an amplifier.
Figure 2:
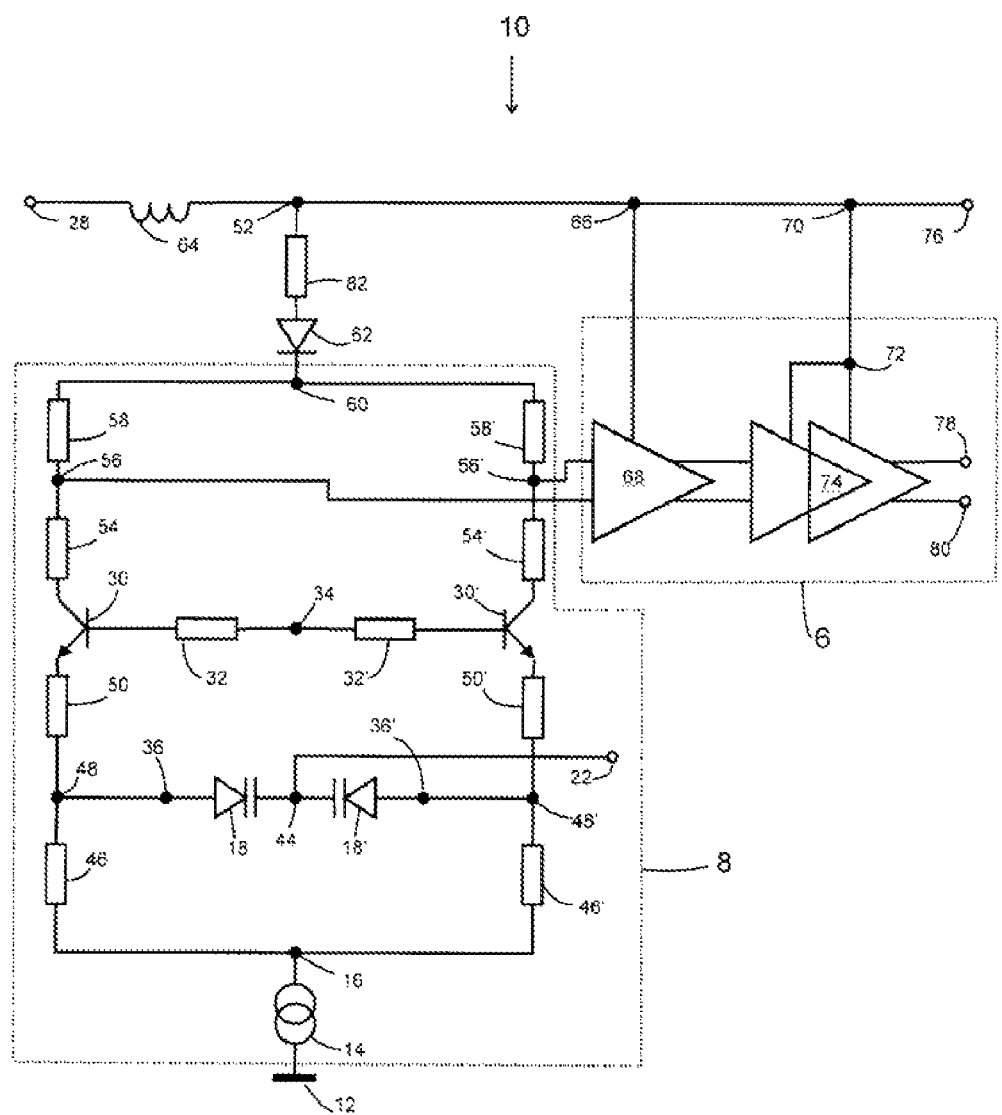
FIG. 2 schematically illustrates an example of an embodiment of an oscillator circuit according to the invention.

Referring to FIG. 2, the oscillator circuit 10 shown in FIG. 2 comprises a resonator 8 having an output terminal 56 for providing an oscillatory output signal thereat and having a supply terminal 60 for receiving a supply voltage from a voltage supply 28. The oscillator circuit in this example comprises two identical subcircuits arranged symmetrically to each other with respect to a virtual ground node 44, one of the subcircuits comprising the inductor 32, the capacitor 18, and the negative-resistance element 30.

The resonator may be implemented in any manner suitable for the specific implementation. In the example of FIG. 2, the resonator 8 comprises an inductor 32, a capacitor 18, and a negative-resistance element 30. In this example, the resonator 8 includes a negative resistance element 30. The negative-resistance, element 30 is an NPN bipolar transistor having a base, a collector, and an emitter, the base being coupled to the resonator's inductor 32, the emitter being coupled to the VCO core's capacitor 18, and the collector being coupled to the output terminal 56.

The circuit further comprises a subsequent circuit 6 coupled to the resonator's output terminal 56 and having a supply terminal 72 for receiving a supply voltage from the voltage supply 28. The subsequent circuit 6 is designed to deliver an output signal that is substantially proportional to the signal generated at the resonator's output terminal 56. In this example, the subsequent circuit 6 comprises an amplifier 74 which is shown here, by way of example, as a double-stage amplifier comprising two operational amplifiers in series. The amplifier 74 is coupled to the VCO core's output terminal 56 via a buffer 68 for reducing a loading of the VCO core's output terminal 56.

A decoupling member 82 is arranged between the resonators supply terminal 60 and the subsequent circuit's supply terminal 72 for preventing high-frequency signals generated by the subsequent circuit 6 at its supply terminal 72 from entering the resonator. In this example, the decoupling member 82 is coupled between the node 52 of the common voltage supply line and the diode 62. Alternatively, the decoupling member 82 could be coupled between the diode 62 and the node 60 for achieving the same decoupling effect. In order to shift the potential with respect to the potential provided at the supply terminal 28, instead of the diode 62, a resistor could be employed. However, using a large diode 62 (reducing the 1/f noise) resulted in less phase noise in comparison with using a resistor instead. In the case of a millimeter wave voltage controlled oscillator, a reduction of phase noise of about 1 to 2 dBc/Hz has been demonstrated by simulations.

The supply voltage to be provided at the terminal 72 is a DC voltage. However, the DC voltage may be spuriously modulated, e.g. by the subsequent circuit 6.

The decoupling member 82 may be implemented in any manner suitable for the specific implementation. The decoupling members 82 impedance for frequencies equal to or higher than the oscillation frequency may be at least ten times larger than for zero-frequency.

The decoupling members 82 impedance may be negligible for the DC operating point and effectively infinite for frequencies at an even harmonic of the oscillation frequency. For example, the decoupling members 82 impedance may be negligible for the DC operating point and effectively infinite for frequencies at the second harmonic of the oscillation frequency.

The decoupling member 82 may comprise an inductor, preferably one having a very large inductance. The inductance may, for example, be of the order of 10 nH or larger. Alternatively or additionally, the decoupling member 82 may comprise a transmission line the length of which is substantially one fourth of the wavelength associated with an integer multiple of the oscillation frequency. In the latter case the transmission line's impedance for the selected harmonic frequency is effectively infinite so as to effectively block that harmonic frequency and neighbouring frequencies from entering the resonator. The length of the transmission line may for example be a quarter of the wavelength of the second harmonic frequency, the latter usually having the highest amplitude among the harmonics generated by the PA 74. The transmission line may in particular be of the type described in U.S. Pat. No. 7,053,722 B2.

The decoupling member 82 is in series with a forward-sense diode 62. Thus harmonic signals from the PA 74 cannot bypass the diode 62.

The resonators output terminal 56 is coupled to the resonators supply terminal 60 via an inductor 58. An inductive voltage divider comprising serially coupled inductors 54, 58 is coupled between the VCO core's supply terminal 60 and the negative-resistance element 30.

Figure 3:
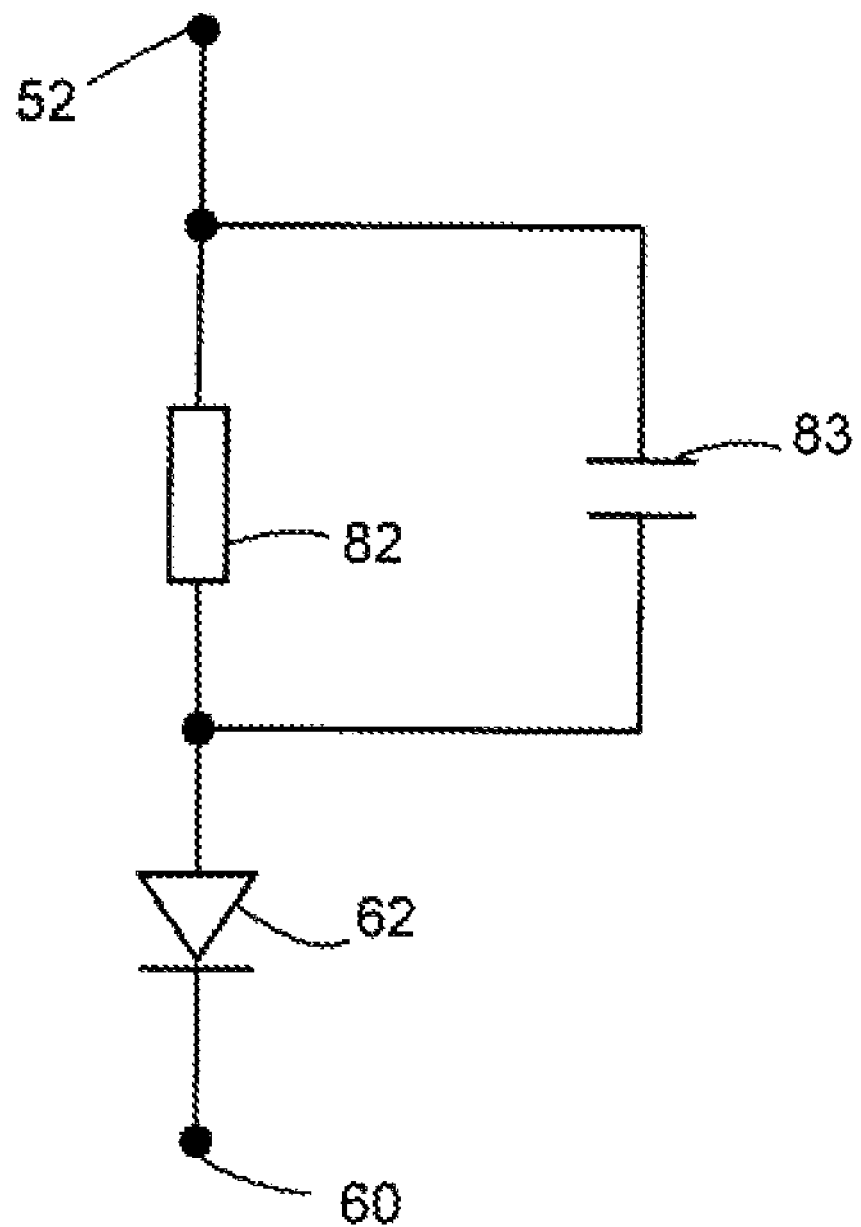
FIG. 3 schematically illustrates an element of another embodiment of an oscillator circuit according to the invention.

Referring now to FIG. 3, there is shown another example of a decoupling element according to the invention. The decoupling member 82, 83 comprises a transmission line 82 and a capacitor 83 coupled in parallel. The decoupling element 82, 83 is coupled between the node 52 and 60 of the circuit 10 that has been described above with reference to FIG. 2.

Figure 4:
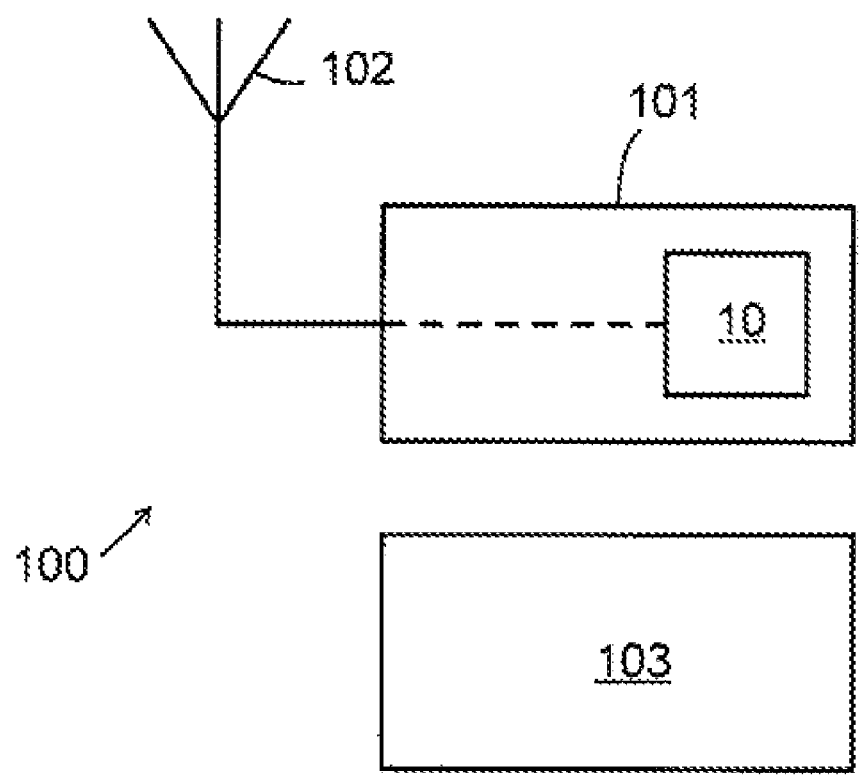
FIG. 4 schematically shows an example of a radar system according to the invention.

Referring to FIG. 4, the oscillator system described above may be used in a radar system, among a very large variety of other applications where an oscillatory signal needs to be generated. The example of a radar system 100 shown in FIG. 4 includes a signal generator 101 connected to an antenna 102. As shown, the signal generator 101 includes a VCO 10 which is used to generate a base signal used by the signal generator 101 to generate a signal of suitable frequency and amplitude with a desired type of modulation. The frequency may for example be above 100 MHz, such as more than 1 GHz, for example (several) tens of GHz, 77 GHz for example.

As shown, the radar system 100 includes a detector 103. The detector 103 can detect the electromagnetic signals emitted via the antenna 102 that are reflected by objects and use the detected electromagnetic signals to generate information about the objects.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, the VCO circuit and the amplifier may not need to be on the same chip.

Other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An oscillator circuit comprising:
a voltage controlled oscillator (VCO) core having an output terminal for providing an oscillatory output signal thereat and having a supply terminal for receiving a supply voltage from a voltage supply;

a subsequent circuit coupled to the output terminal of the VCO core and having a supply terminal for receiving a supply voltage from the voltage supply; and a decoupling member arranged between the supply terminal of the VCO core and the supply terminal of the subsequent circuit for preventing high-frequency signals generated by the subsequent circuit at its supply terminal from entering the VCO core, wherein the decoupling member comprises a transmission line having a first terminal and a second terminal, a diode having a first terminal coupled to the second terminal of the transmission line and a second terminal coupled to the supply terminal of the VCO core, and a capacitor having a first terminal coupled to the first terminal of the transmission line, and a second terminal coupled to the second terminal of the transmission line;

wherein the transmission line has a length of which is substantially one quarter of a wavelength associated with a second harmonic oscillation.

2. The oscillator circuit as claimed in claim 1, wherein the supply voltage is a DC voltage.

3. The oscillator circuit as claimed in claim 1, wherein the subsequent circuit comprises an amplifier.

4. The oscillator circuit as claimed in claim 3, wherein the amplifier is coupled to the VCO core's output terminal via a buffer for decoupling a loading of the VCO core's output terminal.

5. A radar system comprising an oscillator circuit as claimed in claim 3.

6. The oscillator circuit as claimed in claim 1, wherein the subsequent circuit is designed to deliver an output signal that is substantially proportional to the signal generated at the VCO core's output terminal.

7. The oscillator circuit as claimed in claim 1, wherein the VCO core comprises an inductor, a capacitor, and a negative-resistance element.

8. The oscillator circuit as claimed in claim 7, wherein the negative-resistance element is an NPN bipolar transistor having a base, a collector, and an emitter, the base being coupled to the VCO core's inductor, the emitter being coupled to the VCO core's capacitor, and the collector being coupled to the VCO core's output terminal.

9. The oscillator circuit as claimed in claim 7, wherein an inductive voltage divider comprising serially coupled inductors is coupled between the VCO core's supply terminal and the negative-resistance element.

10. A radar system comprising an oscillator circuit as claimed in claim 7.

11. The oscillator circuit as claimed in claim 1, wherein the decoupling member's impedance for frequencies equal to or higher than the VCO core's frequency is at least ten times larger than for zero-frequency.

12. The oscillator circuit as claimed in claim 1, wherein the decoupling member's impedance is negligible in a zero-frequency limit and effectively infinite for even-harmonic frequencies.

13. The oscillator circuit as claimed in claim 1, wherein the oscillatory output signal has a frequency above 1 GHz.

14. The oscillator circuit as claimed in claim 1, wherein the VCO core's output terminal is coupled to the VCO core's supply terminal via an inductor.

15. The oscillator circuit as claimed in claim 1, comprising two identical subcircuits arranged symmetrically to each other with respect to a virtual ground node, one of the subcircuits comprising the inductor, the capacitor, and the negative-resistance element.

16. A radar system comprising an oscillator circuit as claimed in claim 15.

17. A radar system comprising an oscillator circuit as claimed in claim 1.

18. An oscillator circuit comprising:
a voltage controlled oscillator (VCO) core having an output terminal for providing an oscillatory output signal thereat and having a supply terminal for receiving a supply voltage from a voltage supply;
a subsequent circuit coupled to the output terminal of the VCO core and having a supply terminal for receiving a supply voltage from the voltage supply; and
a decoupling member arranged between the supply terminal of the VCO core and the supply terminal of the subsequent circuit for preventing high-frequency signals generated by the subsequent circuit at its supply terminal from entering the VCO core, wherein the decoupling member comprises a transmission line having a first terminal and a second terminal, and a capacitor having a first terminal coupled to the first terminal of the transmission line, and a second terminal coupled to the second terminal of the transmission line;
wherein the transmission line of the decoupling member has an length that is substantially one quarter of a wavelength associated with a second harmonic oscillation.

19. The oscillator circuit as claimed in claim 18, wherein an impedance of the decoupling member is negligible for a direct current operating point and substantially infinite for frequencies at the second harmonic oscillation.

\* \* \* \* \*